United States Patent
Lee et al.

(10) Patent No.: US 7,830,720 B2
(45) Date of Patent: Nov. 9, 2010

(54) METHODS OF PROGRAMMING NON-VOLATILE SEMICONDUCTOR MEMORY DEVICES USING DIFFERENT PROGRAM VERIFICATION OPERATIONS AND RELATED DEVICES

(75) Inventors: Sung-Soo Lee, Gyeonggi-do (KR); Jin-Sung Park, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 255 days.

(21) Appl. No.: 12/119,829

(22) Filed: May 13, 2008

(65) Prior Publication Data

US 2008/0291739 A1 Nov. 27, 2008

(30) Foreign Application Priority Data

May 21, 2007 (KR) .................. 10-2007-0049316

(51) Int. Cl.
*G11C 11/34* (2006.01)
(52) U.S. Cl. .................. 365/185.22; 365/230.06; 365/238.5
(58) Field of Classification Search .......... 365/185.22, 365/230.06, 238.5
See application file for complete search history.

(56) References Cited

U.S. PATENT DOCUMENTS 5,327,383 A * 7/1994 Merchant et al. ........ 365/185.24
6,442,071 B2 * 8/2002 Choi ..................... 365/185.22
7,038,949 B2 * 5/2006 Chae et al. .............. 365/185.23
7,196,933 B2 * 3/2007 Shibata .................. 365/185.22
2006/0050564 A1 3/2006 Kojima et al.

FOREIGN PATENT DOCUMENTS

| KR | 1997-0029855 | 6/1997 |
| KR | 1020030051402 A | 6/2003 |
| KR | 1020030061877 A | 7/2003 |
| KR | 100567158 B1 | 3/2006 |
| KR | 10-0618902 B1 | 8/2006 |

* cited by examiner

*Primary Examiner*—Son Dinh
(74) *Attorney, Agent, or Firm*—Myers Bigel Sibley & Sajovec, P.A.

(57) ABSTRACT

A method of programming a non-volatile memory device includes receiving data to be programmed into memory cells of the memory device, programming the memory cells with the data, and selectively performing one of a plurality of program verify operations based on a current program loop number to determine whether the memory cells have been successfully programmed. For example, one of a wired-OR pass/fail check operation and a Y-scan pass/fail check operation may be performed according to the current program loop number. Related methods and devices are also discussed.

17 Claims, 13 Drawing Sheets

Fig. 8

| Wired-OR Check (Loop 1~n-1) | Y-Scan Check (Loop N) | Wired-OR Check (Loop N+1~Max-1) | Y-Scan Check (Loop Max) | |
|---|---|---|---|---|
| Pass | D/C | D/C | D/C | Program Pass |
| Fail | Pass | D/C | D/C | Program Pass |
| Fail | Fail | Pass | D/C | Program Pass |
| Fail | Fail | Fail | Pass | Program Pass |
| Fail | Fail | Fail | Fail | Program Fail |

(D/C : don't care)

METHODS OF PROGRAMMING NON-VOLATILE SEMICONDUCTOR MEMORY DEVICES USING DIFFERENT PROGRAM VERIFICATION OPERATIONS AND RELATED DEVICES

CROSS-REFERENCE TO RELATED APPLICATIONS

This U.S. non-provisional patent application claims priority under 35 U.S.C.§119 from Korean Patent Application No. 10-2007-0049316 filed on May 21, 2007, the entire contents of which are hereby incorporated by reference.

FIELD OF THE INVENTION

The present invention relates to semiconductor memory devices, and more particularly, to non-volatile semiconductor memory devices and programming methods therefor.

BACKGROUND OF THE INVENTION

There has been increased demand for electrically erasable and programmable semiconductor memory devices that do not require a refresh operation for retaining data. There has also been demand for an increased degree of integration with respect to semiconductor memory devices.

A flash memory device does not need a refresh operation to retain data. Since data may be retained even at power-off, flash memory devices may be widely used in electronic devices.

FIG. 1 is a cross-sectional view of a conventional flash memory cell. Referring now to FIG. 1, a conventional flash memory cell 100 includes a source 120, a drain 130, a floating gate 140, and a control gate 150. The source and drain 120 and 130 are formed in a P-type semiconductor substrate 110, with a channel region between the source 120 and the drain 130. The floating gate 140 is formed on the channel region with a thin insulation film therebetween. The control gate 150 is formed on the floating gate 140 with a thin insulation film therebetween.

The source 120, the drain 130, the control gate 150, and the substrate 110 are connected to corresponding terminals Vs, Vd, Vg, and Vb that are respectively supplied with required voltages for a program, erase or read operation. In a program operation, a program voltage may be applied to a control gate (i.e., a word line) of a selected flash memory cell, and a pass voltage lower than the program voltage may be applied to a control gate (i.e., a word line) of respective unselected flash memory cells. Methods for programming flash memory cells are disclosed in U.S. Pat. No. 5,473,563, the contents of which are hereby incorporated by reference.

In general, it may be difficult to sufficiently program a flash memory cell 100 to a target threshold voltage via one program loop. This means that the flash memory cell 100 may be programmed to have a target threshold voltage via plural program loops. Whether a flash memory cell is programmed may be determined according to the amount of charge accumulated at its floating gate.

Sufficient charge accumulation at a floating gate of a flash memory cell may enable its threshold voltage to be increased, which may result in no current flow between its drain and source. On the other hand, insufficient charge accumulation at a floating gate of a flash memory cell may enable current flow between its source and drain at a lower threshold voltage. Programming of a flash memory cell may be determined by detecting whether current flows via the flash memory cell. In other words, a flash memory cell may be determined to be programmed when a sufficient charge is accumulated at the floating gate to increase the threshold voltage of the flash memory cell. A flash memory cell may be determined not to be programmed when the charge accumulated at the floating gate is not sufficient to increase the threshold voltage of the flash memory cell.

A verify read operation is carried out to determine whether a flash memory cell is programmed. A wired-OR pass/fail check scheme is a known verify read method. In accordance with the wired-OR pass/fail check scheme, signals output from page buffers may be used as inputs of an OR gate, which outputs a detect signal as a pass/fail signal in response to input signals.

FIG. 2 is a block diagram showing a wired-OR pass/fail check circuit of a conventional non-volatile memory device. Referring to FIG. 2, fuses 23_1~23_n are connected to output terminals of page buffers 22_1~22_n. One fuse is connected to multiple page buffers, as illustrated in FIG. 2. A fuse may be cut when one of the bit lines connected to corresponding page buffers is defective. The fuses 23_1~23_n may respectively be used as electrical isolation means.

A signal nWDO from each of the page buffers 22_1~22_n indicates whether a corresponding flash memory cell is programmed normally. For example, when a signal nWDO has a logic high value, it may indicate that a memory cell connected to a corresponding page buffer is not programmed. When a signal nWDO has a logic low value, it may indicate that a memory cell connected to a corresponding page buffer is programmed.

Although not illustrated in FIG. 2, a path for outputting the signals nWDO from the page buffers 22_1~22_n is different from a data input/output path. Each page buffer in the page buffer circuit 220 may include two latches (i.e., a main latch and a sub/auxiliary latch) to support a cache operation. In each page buffer, a main latch may be configured to drive a bit line with a power supply voltage or a ground voltage in response to input data, and a sub/auxiliary latch may be configured to load data in advance. The signals nWDO may be output in response to data stored in main latches of the page buffers 22_1~22_n.

While the signals nWDO are transferred to the wired-OR pass/fail check circuit 240 from the main latches of the page buffers 22_1~22_n, it may be possible to load next data to be programmed onto the sub/auxiliary latches of the page buffers 22_1~22_n. This cache operation may enable a program speed to be improved.

A fuse corresponding to a defective bit line or page buffer may be cut in order to prevent a pass/fail check result from being affected by defective bit lines and/or page buffers. Whether a non-volatile semiconductor memory device includes defective bit lines may be tested prior to shipping. If defective bit lines are detected, fuses corresponding to defective bit lines may be cut. Cutting of fuses may be performed via various cutting techniques such as using a laser beam. Defective bit lines may thereby be isolated from normal bit lines after the corresponding fuses are cut.

With conventional design technologies, it may be difficult to provide each fuse within an area where one page buffer is arranged. For this reason, a layout of the fuses may be provided according to a design scheme where one fuse is connected to at least two page buffers, as illustrated in FIG. 2. This may also require a relatively wide area to arrange fuses, which may make it difficult to design high-density memory devices and/or to lower memory costs.

Accordingly, a Y-scan pass/fail check scheme has been proposed to perform a program verify operation without electrical isolation means such as fuses. The Y-scan pass/fail check scheme may perform a sequential scan of the columns (i.e., bit lines) of a selected page during a program verify operation.

FIG. 3 is a block diagram showing a Y-scan pass/fail check circuit 300 in a conventional non-volatile memory device.

Referring to FIG. 3, a column selector circuit 330 is connected to page buffers 32-1~32_n in a page buffer circuit 320. Data for Y-scan pass/fail check may be output via a data input/output path. In other words, a data output path for a pass/fail check operation may be identical to a conventional data input/output path. For this reason, during a Y-scan pass/fail check operation, it may not be possible to load data onto sub/auxiliary latches of the page buffer circuit 320. The Y-scan pass/fail check scheme may require further time for loading onto a page buffer circuit 320 data to be programmed in a next page of a memory cell array 310. Unlike the wired-OR pass/fail check scheme, the Y-scan pass/fail check scheme may be made such that page buffers 32_1~32_n of the page buffer circuit 320 are checked sequentially. This means that a program time may be increased when the Y-scan pass/fail check scheme is used, as compared with the wired-OR pass/fail check scheme.

SUMMARY OF THE INVENTION

Some embodiments of the present invention provide a method of programming a non-volatile memory device. The method includes programming memory cells via a plurality of program loops. One of the plurality of program loops includes a program verify operation performed in a wired-OR pass/fail check manner, and another one of the plurality of program loops includes a program verify operation performed in a Y-scan pass/fail check manner.

Other embodiments of the present invention provide a method of programming a non-volatile memory device. The method includes receiving data to be programmed into memory cells of the memory device, programming the memory cells with the data, and selectively performing one of a plurality of program verify operations based on a current program loop number to determine whether the memory cells have been successfully programmed. The plurality of program verify operations may include one of a wired-OR pass/fail check operation and a Y-scan pass/fail check operation. The wired-OR pass/fail check operation may be performed when the current program loop number is not equal to a predetermined program loop number and/or a maximum program loop number. The Y-scan pass/fail check operation may be performed when the current program loop number is equal to a predetermined program loop number and/or a maximum program loop number.

Still other embodiments of the present invention provide a non-volatile memory device including a memory cell array having memory cells arranged in rows and columns, an input/output and check circuit configured to perform a data input/output operation and a program verify operation with respect to the memory cell array, and a control logic circuit configured to control the input/output and check circuit to selectively perform one of a plurality of program verify operations based on a current program loop number to determine whether the memory cells have been successfully programmed. For example, the control logic circuit may be configured to control the input/output and check circuit to perform one of a wired-OR pass/fail check operation and a Y-scan pass/fail check operation in response to the current program loop number.

BRIEF DESCRIPTION OF THE DRAWINGS

FIG. 8 is a table showing pass/fail cases caused at a program operation according to some embodiments of the present invention.

DETAILED DESCRIPTION OF EMBODIMENTS OF THE INVENTION

Figure 1:
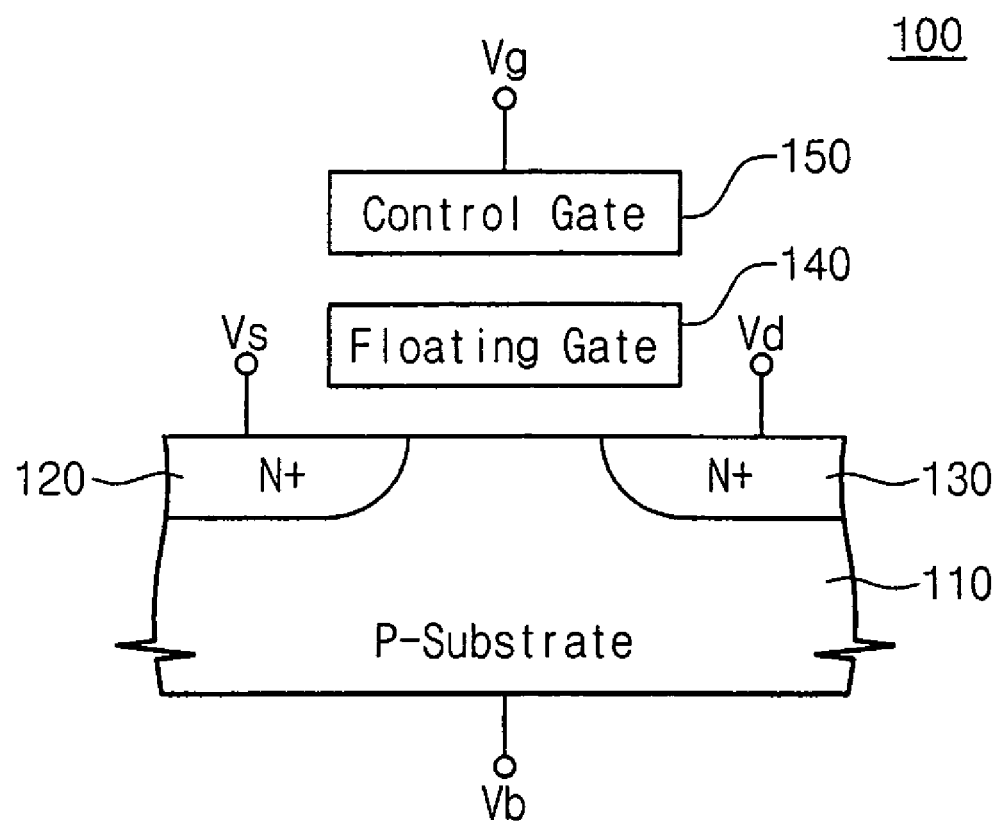
FIG. 1 is a cross-sectional view of a conventional flash memory cell.

The present invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the sizes and relative sizes of layers and regions may be exaggerated for clarity.

It will be understood that when an element is referred to as being "on," "connected to" or "coupled to" another element, it can be directly on, connected or coupled to the other element or layer or intervening elements may be present. In contrast, when an element is referred to as being "directly on," "directly connected to" or "directly coupled to" another element, there are no intervening elements present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 4:
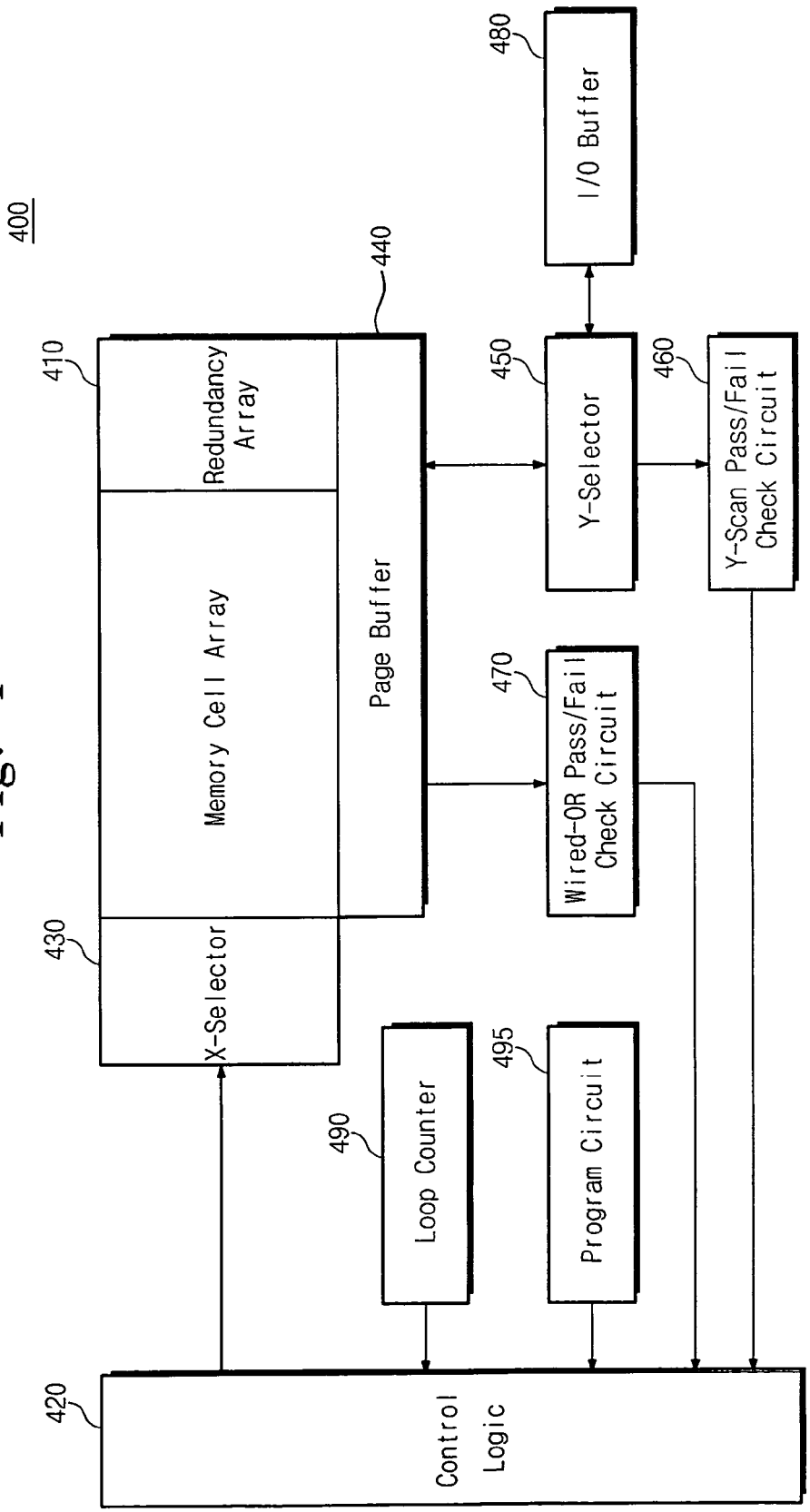
FIG. 4 is a block diagram showing a non-volatile memory device according to some embodiments of the present invention.

FIG. 4 is a block diagram showing a non-volatile memory device according to some embodiments of the present invention n.

Referring to FIG. 4, a non-volatile memory device 400 according to the present invention may include a memory cell array 410, which has memory cells arranged in a matrix of rows (or word lines) and columns (or bit lines) as not shown in FIG. 4. The memory cells of the memory cell array 410 may be arranged to have a NAND or NOR structure. In exemplary embodiments, the memory cells may be arranged to have a NAND structure.

The memory cell array 410 may include a redundancy array, which is used to replace defective memory cells and to store data to be programmed in the defective memory cells. Addresses of defective memory cells are replaced with addresses of the redundancy array. As a result, a column selector or Y-selector circuit 450 may access replaced (or, redundant) memory cells in the redundancy array instead of defective memory cells.

A control logic circuit 420 may be configured to control an overall operation of the non-volatile memory device 400. In some embodiments of the present invention, the control logic circuit 420 may control a set of operations associated with a program operation. But, one skilled in the art will recognize that the control logic circuit 420 is not limited to such a function. For example, the control logic circuit 420 may also be configured to control a read operation, an erase operation, a test operation, and the like.

Continuing to refer to FIG. 4, a row selector or X-selector circuit 430 may be controlled by the control logic circuit 420 and drive selected and unselected rows with corresponding word line voltages in response to a row address. For example, at a program operation, the row selector circuit 430 may drive a selected row with a program voltage and unselected rows with a pass voltage. At a read operation, the row selector circuit 430 may drive a selected row with a read voltage and unselected rows with a pass voltage, respectively.

A page buffer circuit 440 may operate as a sense amplifier or a write driver. At a read operation, the page buffer circuit 440 may read data out of the memory cell array 410. The read data may be stored in latches (not shown) in the page buffer circuit 440. A data read-out operation of the page buffer circuit 440 may be well known to one skilled in the art, and description thereof is thus omitted. At a program operation, the page buffer circuit 440 may receive data via a column selector circuit 450. The page buffer circuit 440 may have multiple page buffers each of which includes two latches, that is, a main latch and a sub/auxiliary latch, to support a cache operation. In each page buffer, a main latch may be configured to drive a corresponding bit line with a power supply voltage or a ground voltage in response to input data, and a sub/auxiliary latch may be configured to load next data in advance.

The column selector circuit 450 may respond to a column address (not shown) and provide a data transfer path. For example, data in the page buffer circuit 440 may be transferred to an input/output buffer circuit 480 via the column selector circuit 450 or to a Y-scan pass/fail check circuit 460 via the column selector circuit 450. In the case that defective memory cells are replaced, the column selector circuit 450 may access replaced memory cells instead of the defective memory cells. The Y-scan pass/fail check circuit 460 may check whether programming of memory cells is successful (i.e., normally or correctly performed) based on data transferred from the column selector circuit 450. An output of the Y-scan pass/fail check circuit 460 may be transferred to the control logic circuit 420.

The input/output buffer circuit 480 may transfer data input from an external device to the column selector circuit 450. The input/output buffer circuit 480 may transfer data provided from the column selector circuit 450 to the external device.

A wired-OR pass/fail check circuit 470 may check whether signals from the page buffer circuit 440 have a pass or fail value. An output of the wired-OR pass/fail check circuit 470 may be transferred to the control logic circuit 420. A loop counter circuit 490 may be controlled by the control logic circuit 420 and may count a current program loop number. A program circuit 495 may store a maximum program loop number and/or another specific program loop number. The maximum program loop number and/or the specific program loop number may be changed according to characteristics of memory cells. The control logic circuit 420 may refer to the maximum and specific program loop numbers stored in the program circuit 495 at a program operation.

The control logic circuit 420 may control the constituent elements such that a different program verify operation (i.e., one of a wired-OR pass/fail check operation and a Y-scan pass/fail check operation) is selectively performed according to a current program loop number.

With the above-described configuration, in a program verify operation, a wired-OR pass/fail check operation and a Y-scan pass/fail check operation may be selectively performed according to a current program loop number.

Figure 5:
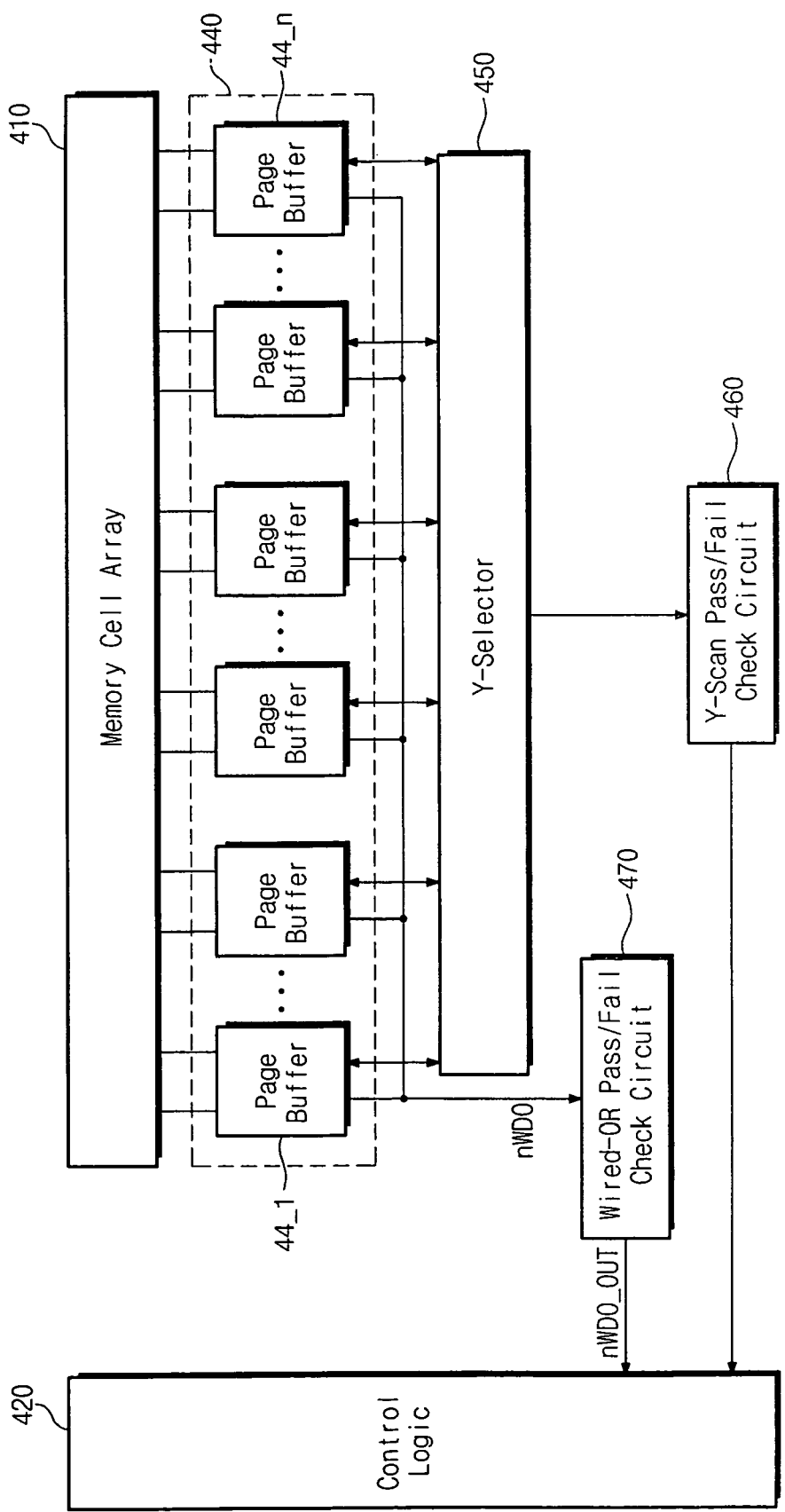
FIG. 5 is a block diagram showing a page buffer circuit and pass/fail check circuits illustrated in FIG. 4 according to some embodiments of the present invention.

FIG. 5 is a block diagram showing a page buffer circuit and pass/fail check circuits as illustrated in FIG. 4.

Referring to FIG. 5, a page buffer circuit 440 may include a plurality of page buffers 44_1~44_n, each of which outputs a signal nWDO. The signal nWDO indicates whether a memory cell is programmed normally. For example, the signal nWDO may have a logic low value when a memory cell is normally programmed and a logic high value when a memory cell is not programmed.

A wired-OR pass/fail check circuit 470 may output a check signal (or, a pass/fail signal) nWDO_OUT in response to signals nWDO output from the page buffer circuit 440. Although not illustrated in figures, the wired-OR pass/fail check circuit 470 may output a check signal nWDO_OUT of a logic low value when all signals nWDO have a logic low value. The check signal nWDO_OUT of a logic low value indicates that memory cells in a selected page are programmed normally. On the other hand, the wired-OR pass/fail check circuit 470 may output the check signal nWDO_OUT of a logic high level when at least one signal nWDO has a logic high value. The check signal nWDO_OUT of a logic high value indicates that all or a part of memory cells in a selected page is not programmed. The check signal nWDO_OUT output from the wired-OR pass/fail check circuit 470 may be transferred to the control logic circuit 420. The column selector circuit 450 is connected to page buffers 44_1~44_n. Data bits read by the page buffers 44_1~44_n may be transferred to the Y-scan pass/fail check circuit 460 via the column selector circuit 460.

As illustrated in FIG. 5, the Y-scan pass/fail check circuit 460 is connected to the page buffers 44_1~44_n via the column selector circuit 450, while the wired-OR pass/fail check circuit 470 is connected directly and commonly to the page buffers 44_1~44_n.

Figure 6:
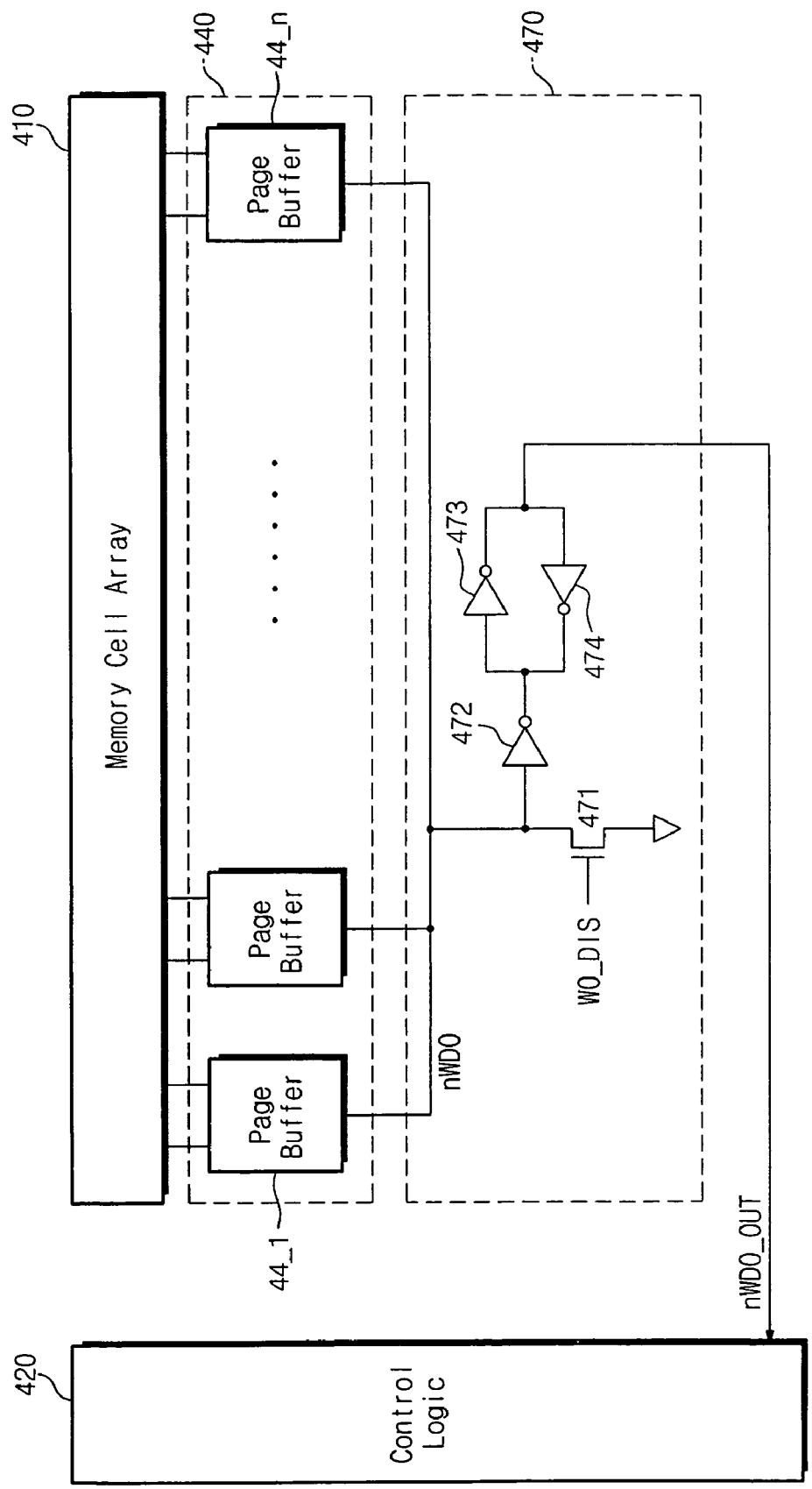
FIG. 6 is a circuit diagram showing a wired-OR pass/fail check circuit illustrated in FIG. 5 according to some embodiments of the present invention.

FIG. 6 is a circuit diagram showing a wired-OR pass/fail check circuit as illustrated in FIG. 5.

Referring to FIG. 6, a wired-OR pass/fail check circuit 470 may include an NMOS transistor 471 and inverters 472, 473, and 474 which are connected as illustrated in FIG. 6. The inverters 473 and 474 are connected to form a latch. The wired-OR pass/fail check circuit 470 may receive signals nWDO from a page buffer circuit 440. The wired-OR pass/fail check circuit 470 may output a check signal nWDO_OUT of a logic low value when all signals nWDO have a logic low value.

The check signal nWDO_OUT indicates whether all memory cells in a selected page are programmed normally. The check signal nWDO_OUT of a logic high value means that at least one memory cell in a selected page is not programmed. On the other hand, the check signal nWDO_OUT of a logic low value means that all memory cells in a selected page are programmed normally. The check signal nWDO_OUT may be applied to a control logic circuit 420.

Figure 7:
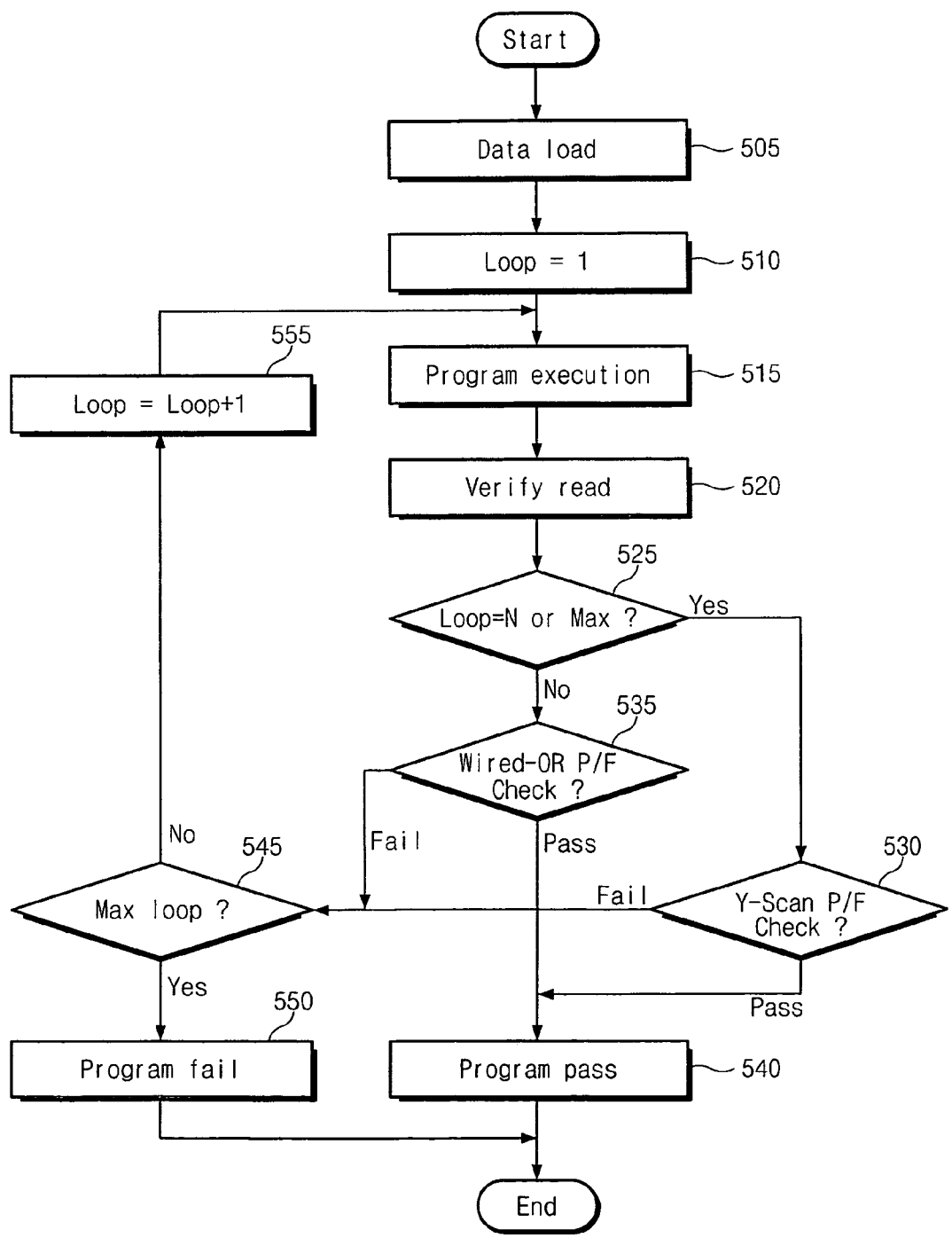
FIG. 7 is a flow diagram for describing a program method of a non-volatile memory device illustrated in FIG. 4 according to some embodiments of the present invention.

FIG. 7 is a flow diagram for describing a program method of a non-volatile memory device as illustrated in FIG. 4.

First of all, in block 505, data to be programmed may be loaded onto a page buffer circuit 440. In block 510, a program loop number is reset to '1'. In block 515, the loaded data may be programmed in selected memory cells. Programming memory cells is well known to one skilled in the art, and description thereof is thus omitted.

In block 520, a verify read operation is performed to determine whether memory cells are programmed to have a required threshold voltage. Data bits read from memory cells may be stored in latches in the page buffer circuit 440.

In performing the verify read operation, in block 525, a control logic circuit 420 may check a current program loop number. If the current program loop number is determined to be a specific program loop number N and/or a maximum program loop number, in block 530, a Y-scan pass/fail check operation may be carried out under the control of the control logic circuit 420. If the current program loop number is not determined to be the specific program loop number N or the maximum program loop number, in block 535, a wired-OR pass/fail check operation may be carried out under the control of the control logic circuit 420.

The specific program loop number N is capable of being set to have various values. In some embodiments, the specific program loop number may be set to a program loop number where memory cells are programmed on the average. For example, if memory cells are normally programmed after a 10$^{th}$ program loop is executed, the specific program loop number may be set to 10. It is possible to determine the specific program loop number N in various manners according to characteristics of memory cells. The specific program loop number N can be set to have multiple values. For example, if a maximum program loop number is 20, the specific program loop number N may be set to have 5, 10, and 15. In this case, the Y-scan pass/fail check operation may be carried out at 5$^{th}$, 10$^{th}$, and 15$^{th}$ program loops, respectively.

As a result of a wired-OR pass/fail check operation at block 535 or a Y-scan pass/fail check operation at block 530, if all memory cells in a selected page are determined to be programmed normally, the procedure goes to block 540, in which a program operation is determined as a program pass. Afterwards, the program operation may be ended. However, if at least one memory cell in a selected page is not determined to be programmed normally as a result of a wired-OR pass/fail check operation at block 535 or a Y-scan pass/fail check operation at block 530, the procedure goes to block 545, in which the control logic circuit 420 checks whether a current program loop number has reached a maximum program loop number.

If a current program loop is determined to have reached the maximum program loop number, the procedure goes to block 550, in which a program operation is determined as a program fail. Afterwards, the program operation may be ended. In other words, if all memory cells in a selected page are not programmed after the maximum number of program loops, the program operation may be determined to have failed. On the other hand, if a current program loop number is less than a maximum program loop number, in block 555, the current program loop number is increased by '1', and the procedure goes back to block 515.

Figure 2:
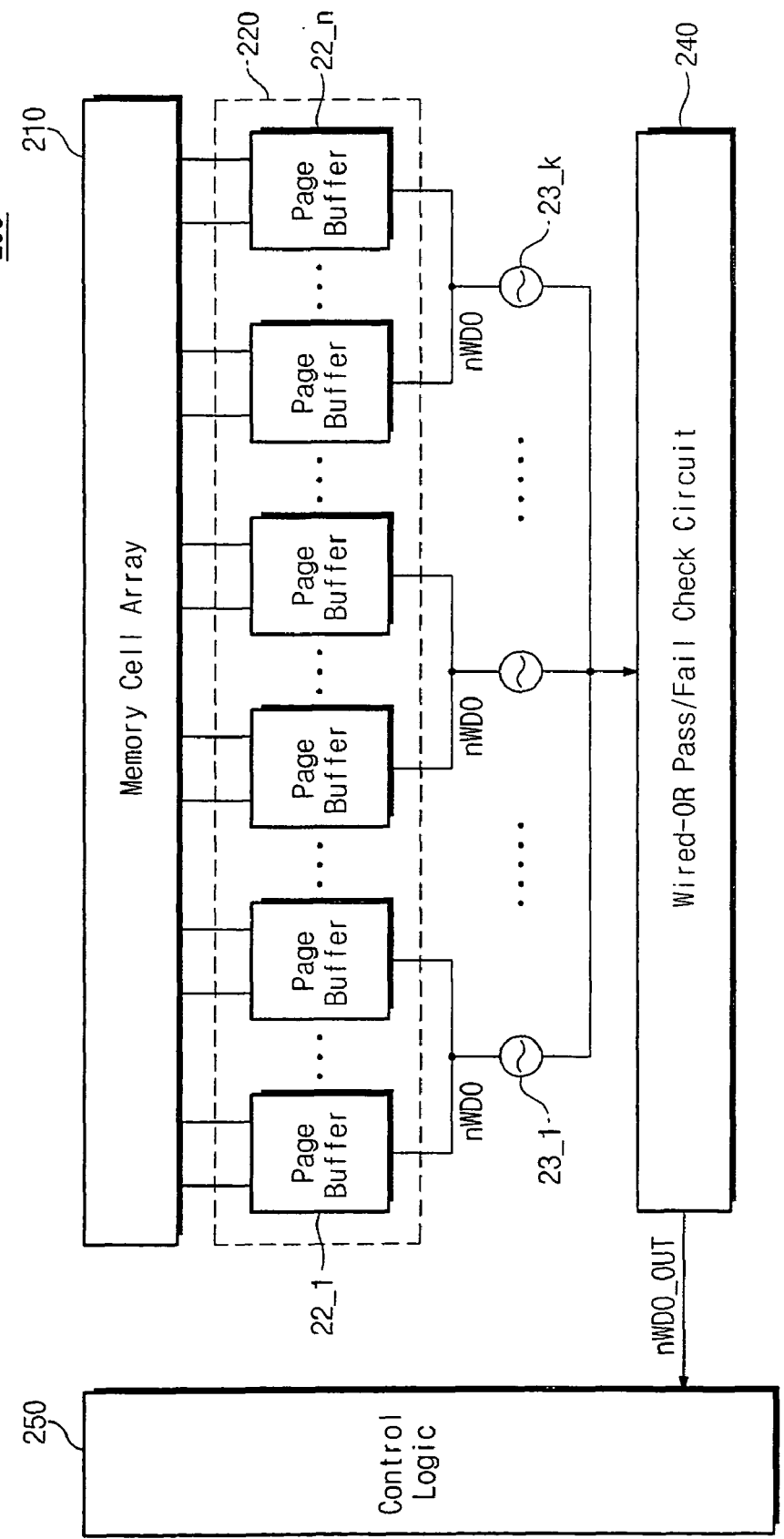
FIG. 2 is a block diagram showing a wired-OR pass/fail check circuit of a conventional non-volatile memory device.
Figure 3:
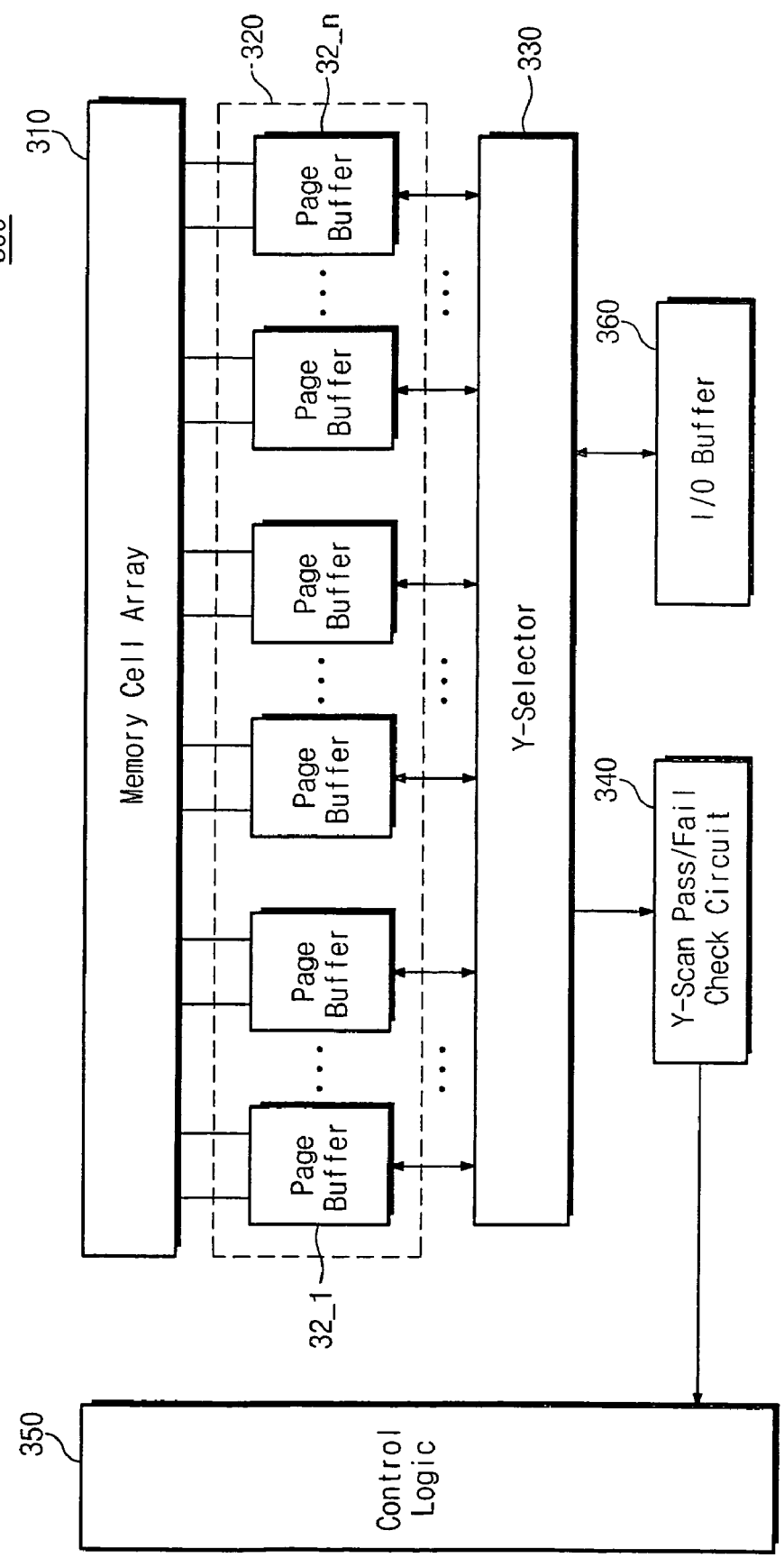
FIG. 3 is a block diagram showing a Y-scan pass/fail check circuit of a conventional non-volatile memory device.

As described above, a wired-OR pass/fail check operation and a Y-scan pass/fail check operation are selectively performed according to a current program loop number in a program operation. In particular, it may possible to improve a program speed by performing a wired-OR pass/fail check operation during most program loops. Further, a layout area may be reduced by performing a Y-scan pass/fail check operation, which does not require fuses (refer to FIG. 2), at a specific program loop.

FIG. 8 is a table showing pass/fail cases caused at a program operation according to some embodiments of the present invention. In the embodiments of FIG. 8, a Y-scan pass/fail check operation may be performed at both an Nth program loop and a maximum program loop, respectively. Five cases may arise according to the above-described pass/fail check conditions. In FIG. 8, the symbol 'D/C' indicates don't care.

CASE 1: an initial wired-OR pass/fail check result indicates a program pass. This means that all memory cells in a selected page are programmed normally. This case may arise when all bit lines are not defective. It may be possible to improve a program speed using a cache operation since a wired-OR pass/fail check operation is made.

CASE 2: when an initial wired-OR pass/fail check result indicates a program fail, a Y-scan pass/fail check operation may be performed at a specific program loop N. If the Y-scan pass/fail check operation indicates a program pass, all memory cells are determined to be programmed normally. Additional isolation means (e.g., fuses) are not required since a Y-scan pass/fail check operation is carried out. Accordingly, a non-volatile memory device according to some embodiments of the present invention may be advantageous from a layout perspective.

CASE 3: if an initial wired-OR pass/fail check result indicates a program fail, as described above, a Y-scan pass/fail check operation may be performed at a specific program loop N. When the Y-scan pass/fail check result indicates a program fail, the wired-OR pass/fail check operation may be again performed. If a wired-OR pass/fail check result indicates a program pass, all memory cells in a selected page are determined to be programmed normally. This case may arise when all bit lines are not defective. It may be possible to improve a program speed using a cache operation since a wired-OR pass/fail check operation is made.

CASE 4: if an initial wired-OR pass/fail check result indicates a program fail, as described above, a Y-scan pass/fail check operation may be performed at a specific program loop N. When the Y-scan pass/fail check result indicates a program fail, the wired-OR pass/fail check operation may be again performed. If a wired-OR pass/fail check result indicates a program fail, a Y-scan pass/fail check operation may be again performed at the maximum number of program loops. If the Y-scan pass/fail check result indicates a program pass, all memory cells in a selected page are determined to be programmed normally. Additional isolation means (e.g., fuses) may not be required, since a Y-scan pass/fail check operation is carried out. Accordingly, a non-volatile memory device according to some embodiments of the present invention may be advantageous from a layout perspective.

CASE 5: if an initial wired-OR pass/fail check result indicates a program fail, as described above, a Y-scan pass/fail check operation may be performed at a specific program loop N. When the Y-scan pass/fail check result indicates a program fail, the wired-OR pass/fail check operation may be again performed. If the wired-OR pass/fail check result indicates a program fail, a Y-scan pass/fail check operation may be again performed at a maximum program loop. If a Y-scan pass/fail check result of a final program loop indicates a program fail, a program operation may be determined to be a program fail.

Figure 9:
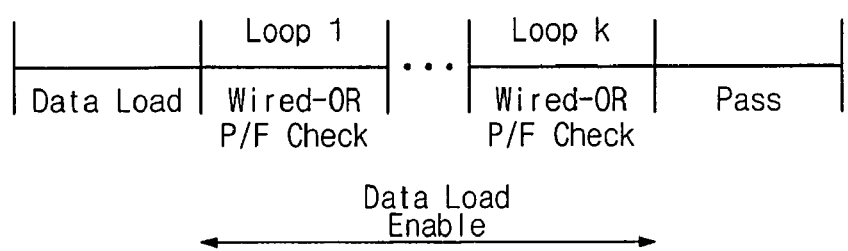
FIGS. 9 to 13 are diagrams showing the pass/fail cases illustrated in FIG. 8 according to some embodiments of the present invention.

FIG. 9 is a diagram showing the first case illustrated in FIG. 8.

First of all, data may be loaded onto a page buffer circuit 440, and a first program loop may commence. A program verify operation may be carried out via a wired-OR pass/fail check scheme from a first program loop to a program loop previous to a specific program loop N. FIG. 9 shows the case that all memory cells in a selected page are programmed normally at a Kth program loop. It is possible to load data in the page buffer circuit 440 in advance while a wired-OR pass/fail check operation is carried out from a first program loop to a Kth program loop. Accordingly, program speed is improved.

Figure 10:
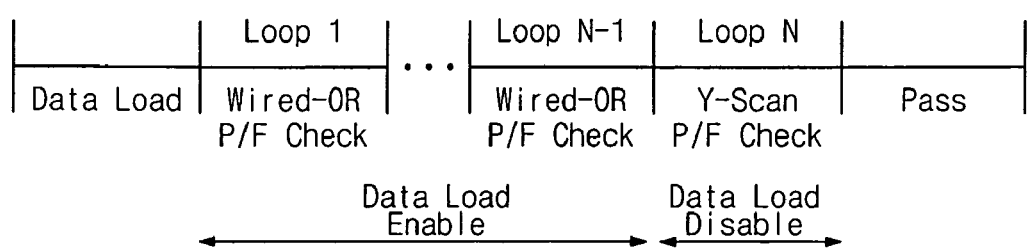

FIG. 10 is a diagram showing the second case illustrated in FIG. 8.

Data may be loaded onto a page buffer circuit 440, and a first program loop may commence. A program verify operation may be carried out via a wired-OR pass/fail check scheme from a first program loop to a program loop N−1 previous to a specific program loop N. If a wired-OR pass/fail check result of a program loop N−1 previous to the specific program loop N indicates a program fail, a Y-scan pass/fail check operation may be performed at the specific program loop N. If all memory cells in a selected page are programmed normally at the specific program loop N, the program operation may be determined as a program pass.

While a wired-OR pass/fail check operation is performed from a first program loop to a (N−1) program loop, data to be programmed may be loaded onto the page buffer circuit 440. No additional time is required to load data. This means that a program speed is improved. Additional isolation means (e.g., fuses) are not required since a Y-scan pass/fail check operation is carried out at an Nth program loop. Accordingly, a non-volatile memory device according to some embodiments of the present invention may be advantageous from a layout perspective.

Figure 11:
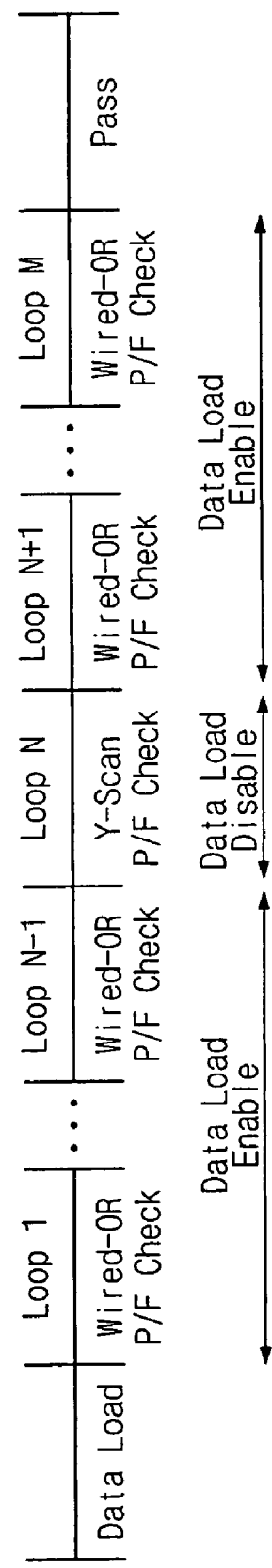

FIG. 11 is a diagram showing the third case illustrated in FIG. 8.

Data may be loaded onto a page buffer circuit 440, and a first program loop may commence. A program verify operation may be carried out via a wired-OR pass/fail check scheme from a first program loop to a program loop N−1 previous to a specific program loop N. If a wired-OR pass/fail check result of a program loop N−1 previous to the specific program loop N indicates a program fail, a Y-scan pass/fail check operation may be performed at the specific program loop N. If the Y-scan pass/fail check result of the specific program loop N indicates a program fail, a wired-OR pass/fail check operation may be performed again. When all memory cells in a selected page are programmed normally at an Mth program loop, the program operation may be determined as a program pass.

While a wired-OR pass/fail check operation is performed from the N+1)th program loop to the Mth program loop, data to be programmed may be loaded onto the page buffer circuit 440. No additional time may be required to load data. This means that a program speed may be improved.

Figure 12:
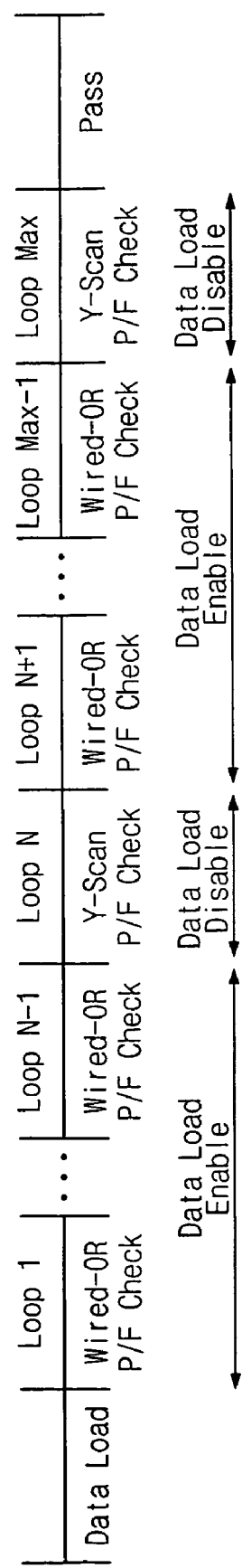

FIG. 12 is a diagram showing the fourth case illustrated in FIG. 8.

Data may be loaded onto a page buffer circuit 440, and a first program loop may commence. A program verify operation may be carried out via a wired-OR pass/fail check scheme from a first program loop to a program loop N−1 previous to a specific program loop N. If a wired-OR pass/fail check result of a program loop N−1 previous to the specific program loop indicates a program fail, a Y-scan pass/fail check operation may be performed at the specific program loop N. If the Y-scan pass/fail check result of the specific program loop N indicates a program fail, a wired-OR pass/fail check operation may be performed again. If a wired-OR pass/fail check result of a program loop Max−1 previous to a maximum program loop indicates a program fail, a Y-scan pass/fail check operation may be made at the maximum program loop. When all memory cells in a selected page are programmed normally at the maximum program loop, the program operation may be determined as a program pass.

As described above, since two pass/fail check schemes are used at the same time, the non-volatile memory device may advantageously improve program speed and/or device layout.

Figure 13:
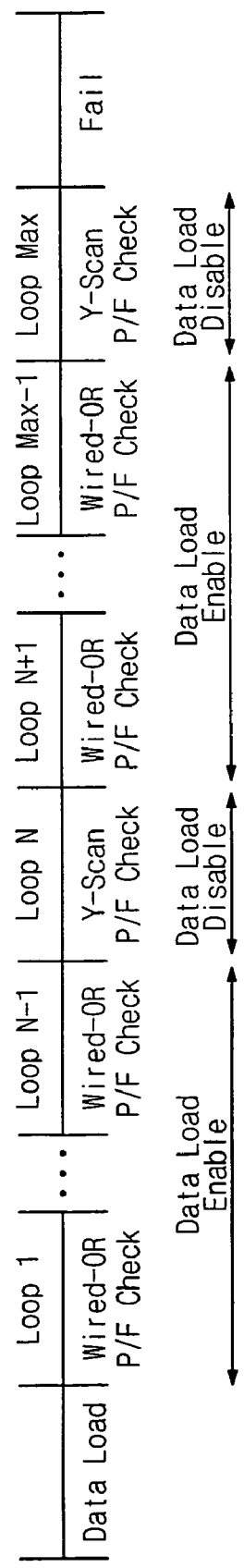

FIG. 13 is a diagram showing the fifth case illustrated in FIG. 8.

Firstly, data may be loaded onto a page buffer circuit 440, and a first program loop may commence. A program verify operation may be carried out via a wired-OR pass/fail check scheme from a first program loop to a program loop N−1 previous to a specific program loop N. If a wired-OR pass/fail check result of a program loop previous to the specific program loop indicates a program fail, a Y-scan pass/fail check operation may be performed at the specific program loop N. If the Y-scan pass/fail check result of the specific program loop N indicates a program fail, a wired-OR pass/fail check operation may be performed again. If a wired-OR pass/fail check result of a program loop Max−1 previous to a maximum program loop indicates a program fail, a Y-scan pass/fail check operation may be made at the maximum program loop. When a pass/fail check result of the maximum program loop indicates a program fail, the program operation may be determined as a program fail.

As set forth above, by selectively using wired-OR and Y-scan pass/fail check schemes, the non-volatile memory device may not require additional isolation means and may reduce the time needed to perform a program operation.

Figure 14:
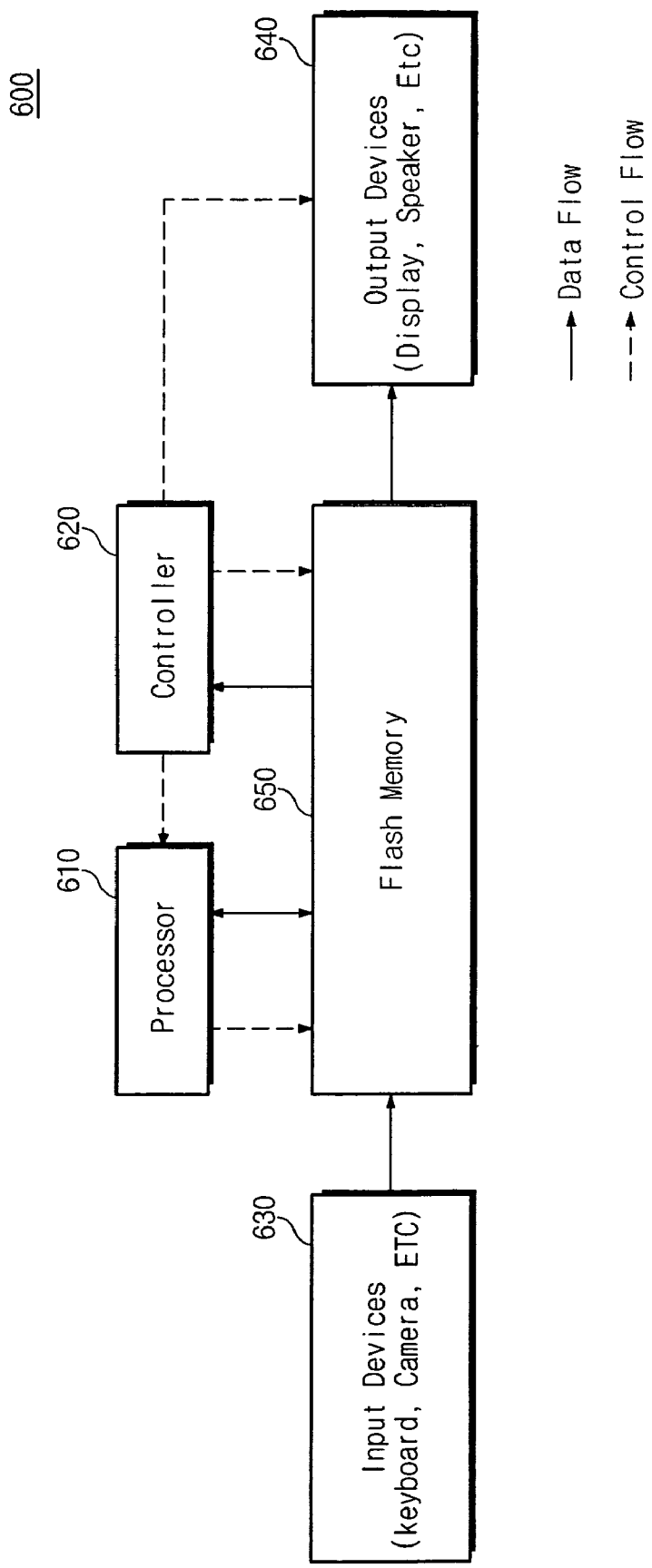
FIG. 14 is a block diagram showing a computing system including a flash memory device according to some embodiments of the present invention.

FIG. 14 is a block diagram showing a computing system including a flash memory device according to some embodiments of the present invention.

Referring to FIG. 14, a computing system 600 according to the present invention may include a processor 610, a controller 620, input devices 630, output devices 640, and a flash memory 650. In FIG. 14, a dotted line indicates control flow, and a solid line indicates data flow.

The computing system 600 may receive external data via the input devices 630 such as a keyboard, a camera, and the like. The received data may include, for example, a command by a user or multimedia data such as image data taken via a camera. The received data may be stored in the flash memory 650. The controller 620 may control constituent elements of the computing system 600 in response to a command stored in the flash memory 650. The processor 610 may process a command required by the controller 620, and the processed result may be stored in the flash memory 650. The output devices 640 may output data stored in the flash memory 650 in response to the control of the controller 620. The output devices 640 may output data stored in the flash memory 650 so as to be recognized by a user. For example, the output devices 650 may include a display, a speaker, and the like.

The flash memory 650 may be configured substantially similar to that illustrated in FIG. 4. N-bit data (where N is greater or equal to 1) to be processed by the processor 610 may be stored in the flash memory 650 under the control of the controller 620. Although not illustrated in FIG. 14, the computing system 600 further includes a power supply for supplying power to the computing system 600. Additionally, in a case where the computing system 600 is a mobile apparatus, a battery may be further provided in the computing system 600 to supply power to the computing system 600.

As a program speed of the flash memory 650 is improved, the performance of the computing system 600 may be also improved. Further, it may be possible to reduce production costs of the computing system when the flash memory 650 does not require electrical isolation means (e.g., fuses). The flash memory 650 and the controller 620 can be configured to form a memory card.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

That which is claimed:

1. A method of programming a non-volatile memory device, the method comprising:
    programming memory cells of the memory device via a plurality of program loops, wherein one of the plurality of program loops includes a program verify operation comprising a wired-OR pass/fail check operation, and wherein another one of the plurality of program loops includes a program verify operation comprising a Y-scan pass/fail check operation,
    wherein programming the memory cells comprises selectively performing the one of the plurality of program loops including the program verify operation comprising the wired-OR pass/fail check operation when a current program loop number is not equal to a predetermined program loop number and/or a maximum program loop number.

2. The method of claim 1, wherein the memory cells are arranged to provide a NAND structure.

3. The method of claim 1, wherein programming the memory cells further comprises:
    selectively performing the one of the plurality of program loops including the program verify operation comprising the Y-scan pass/fail check operation when the current program loop number is equal to the predetermined program loop number and/or the maximum program loop number.

4. A method of programming a non-volatile memory device, the method comprising:
    receiving data to be programmed into memory cells of the memory device;
    programming the memory cells with the data; and
    selectively performing one of a plurality of program verify operations based on a current program loop number to determine whether the memory cells have been successfully programmed,
    wherein selectively performing one of the plurality of program verify operations comprises performing a wired-OR pass/fail check operation when the current program loop number is not equal to a predetermined program loop number and/or a maximum program loop number.

5. The method of claim 4, wherein selectively performing one of the plurality of program verify operations comprises performing one of the wired-OR pass/fail check operation and a Y-scan pass/fail check operation in response to the current program loop number.

6. The method of claim 4, wherein performing the wired-OR pass/fail check operation comprises:
    loading next data to be programmed into a page buffer circuit during performing the wired-OR pass/fail check operation.

7. The method of claim 4, wherein selectively performing one of the plurality of program verify operations further comprises:
    performing a Y-scan pass/fail check operation when the current program loop number is equal to a predetermined program loop number and/or a maximum program loop number.

8. The method of claim 7, wherein performing the Y-scan pass/fail check operation comprises:
    preventing loading of next data to be programmed into a page buffer circuit during performing the Y-scan pass/fail check operation.

9. A non-volatile memory device comprising:
    a memory cell array comprising memory cells arranged in rows and columns;
    an input/output and check circuit configured to perform a data input/output operation and a program verify operation with respect to the memory cell array; and
    a control logic circuit configured to control the input/output and check circuit to selectively perform one of a wired-OR pass/fail check operation and a Y-scan pass/fail check operation in response to a current program loop number to determine whether the memory cells have been successfully programmed, and wherein the control logic circuit is configured to control the input/output and check circuit to perform the wired-OR pass/fail check operation when the current program loop number is not equal to a predetermined program loop number and/or a maximum program loop number.

10. The non-volatile memory device of claim 9, further comprising:
    a page buffer circuit connected to the memory cell array, wherein the control logic circuit is configured to enable loading of next data to be programmed into the page buffer circuit during performance of the wired-OR pass/fail check operation.

11. The non-volatile memory device of claim 9, wherein the memory cell array further comprises redundant memory cells.

12. The non-volatile memory device of claim 9, wherein the control logic circuit is further configured to control the input/output and check circuit to perform the Y-scan pass/fail check operation when the current program loop number is equal to the predetermined program loop number and/or the maximum program loop number.

13. A non-volatile memory device comprising:
a memory cell array comprising memory cells arranged in rows and columns;
an input/output and check circuit configured to perform a data input/output operation and a program verify operation with respect to the memory cell array; and
a control logic circuit configured to control the input/output and check circuit to selectively perform one of a wired-OR pass/fail check operation and a Y-scan pass/fail check operation in response to a current program loop number to determine whether the memory cells have been successfully programmed, and wherein the control logic circuit is configured to control the input/output and check circuit to perform the Y-scan pass/fail check operation when the current program loop number is equal to a predetermined program loop number and/or a maximum program loop number.

14. The non-volatile memory device of claim 13, further comprising:
a page buffer circuit connected to the memory cell array,
wherein the control logic circuit is configured to disable loading of next data to be programmed into the page buffer circuit during performance of the Y-scan pass/fail check operation.

15. The non-volatile memory device of claim 13, wherein the control logic circuit is further configured to control the input/output and check circuit to perform the wired-OR pass/fail check operation when the current program loop number is not equal to the predetermined program loop number and/or the maximum program loop number.

16. A non-volatile memory device comprising:
a memory cell array comprising memory cells arranged in rows and columns;
an input/output and check circuit configured to perform a data input/output operation and a program verify operation with respect to the memory cell array; and
a control logic circuit configured to control the input/output and check circuit to selectively perform one of a wired-OR pass/fail check operation and a Y-scan pass/fail check operation in response to a current program loop number to determine whether the memory cells have been successfully programmed,
wherein the input/output and check circuit comprises:
a row selector circuit configured to select rows of the memory cell array;
a page buffer circuit connected to the memory cell array via the columns;
a column selector circuit configured to select page buffers in the page buffer circuit;
a wired-OR pass/fail check circuit configured to generate a check signal indicating a program pass/fail based upon data from the page buffer circuit during the program verify operation; and
a Y-scan pass/fail check circuit configured to generate a check signal indicating a program pass/fail based upon data from the column selector circuit during the program verify operation.

17. The non-volatile memory device of claim 16, wherein each of the page buffers in the page buffer circuit comprises a main latch and a sub latch.

* * * * *